(12) United States Patent
Boles et al.

(10) Patent No.: US 12,315,770 B2
(45) Date of Patent: May 27, 2025

(54) EDGE ENCAPSULATION FOR HIGH VOLTAGE DEVICES

(71) Applicant: MACOM Technology Solutions Holdings, Inc., Lowell, MA (US)

(72) Inventors: Timothy Boles, Santa Clara, CA (US); David Hoag, Santa Clara, CA (US); Luis Baez, Santa Clara, CA (US); Margaret Barter, Santa Clara, CA (US); James Brogle, Santa Clara, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 309 days.

(21) Appl. No.: 17/723,643

(22) Filed: Apr. 19, 2022

(65) Prior Publication Data

US 2022/0367303 A1  Nov. 17, 2022

Related U.S. Application Data (60) Provisional application No. 63/178,060, filed on Apr. 22, 2021.

(51) Int. Cl.
| | |
|---|---|
| *H01L 23/29* | (2006.01) |
| *H01L 21/56* | (2006.01) |
| *H01L 23/31* | (2006.01) |

(52) U.S. Cl.
CPC .......... *H01L 23/291* (2013.01); *H01L 21/561* (2013.01); *H01L 23/3171* (2013.01);
(Continued)

(58) Field of Classification Search
CPC ............... H01L 23/291; H01L 23/3171; H01L 23/3192; H01L 21/56; H01L 23/3185
See application file for complete search history.

(56) References Cited

U.S. PATENT DOCUMENTS

| | | | |
|---|---|---|---|
| 9,391,263 B2 * | 7/2016 | von Koblinski | ........ H01L 24/06 |
| 10,505,137 B2 | 12/2019 | Ma | |

(Continued)

FOREIGN PATENT DOCUMENTS

| | | | |
|---|---|---|---|
| DE | 102016100011 A1 * | 4/2017 | ............ H01L 21/56 |
| JP | 56-45057 | 4/1981 | |

OTHER PUBLICATIONS

Invitation to Pay Additional Fees and, Where Applicable, Protest Fee for International Application No. PCT/US2022/025673, mailed Aug. 17, 2022.

(Continued)

*Primary Examiner* — Walter H Swanson
*Assistant Examiner* — Moataz Khalifa
(74) *Attorney, Agent, or Firm* — Sheridan Ross P.C.

(57) ABSTRACT

A semiconductor device architecture includes a silicon substrate having sidewalls that are passivated by encapsulating the sidewalls in dielectric materials having high electric field strength. Encapsulating all the sidewalls using high field strength dielectric materials eliminates electrical paths in air or vacuum and confines the electric fields in these high field strength materials, increasing the breakdown voltage relative to unencapsulated devices and allowing the device to withstand greater standoff voltages. In some cases, encapsulating the sidewalls in this manner can allow the device to withstand voltages of 500V or greater.

20 Claims, 11 Drawing Sheets

Oxidation of Die Edges (On Wafer)

(52) U.S. Cl.
CPC ...... *H01L 23/3185* (2013.01); *H01L 23/3192* (2013.01); *H01L 23/293* (2013.01)

(56) References Cited

U.S. PATENT DOCUMENTS

| | | | |
|---|---|---|---|
| 10,937,990 B2 | 3/2021 | Yoo | |
| 11,075,330 B2 | 7/2021 | Li | |
| 11,075,357 B2 | 7/2021 | Mandlik | |
| 2017/0323982 A1 | 11/2017 | Scarpulla | |
| 2018/0068975 A1* | 3/2018 | Rupp | H01L 21/4803 |
| 2020/0411434 A1* | 12/2020 | Nakashiba | H01L 23/291 |

OTHER PUBLICATIONS

International Preliminary Report on Patentability for International Application No. PCT/US2022/025673, mailed Nov. 2, 2023.
International Search Report & Written Opinion for PCT Application Serial No. PCT/US2022/025673, mailed Oct. 11, 2022, 18 pages.

* cited by examiner

Oxidation of Die Edges (On Wafer)

FIG. 2b Oxidation of Die Edges (Diced)

FIG. 3a

Glass Bonding Die Edge Encapsulation (On Wafer)

FIG. 3b

FIG. 4a Glass Bonding/Oxidization Die Edge Encapsulation (On Wafer)

FIG. 4b  Glass Bonding/Oxidization Die Edge Encapsulation (Diced)

FIG. 5a

High Temperature Polymer Bonding/Oxidization for Die Edge Encapsulation (On Wafer)

FIG. 5b

High Temperature Polymer Bonding/Oxidization for Die Edges Encapsulation (Diced)

FIG. 6

FIG. 7

EDGE ENCAPSULATION FOR HIGH VOLTAGE DEVICES

CROSS-REFERENCE TO RELATED APPLICATIONS

This application claims priority to U.S. Provisional Patent Application Ser. No. 63/178,060, filed on Apr. 22, 2021, and entitled "EDGE ENCAPSULATION FOR HIGH VOLTAGE DEVICES," the entirety of which is incorporated herein by reference.

TECHNICAL FIELD

The subject disclosure relates generally to semiconductor devices.

BACKGROUND

Many semiconductor devices are limited in their ability to withstand high standoff voltage bias between their terminals due to both the electric field strength of the dielectric materials used to provide electrical isolation and the electrical path length between opposing terminals. The electrical path length is a limiting factor that prevents semiconductor devices from being able to withstand high standoff voltages.

The above-described description is merely intended to provide a contextual overview of current semiconductor designs and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, a semiconductor device is provided, comprising a silicon substrate; and one or more encapsulation materials having high field strength that encapsulate sidewalls of the silicon substrate to enable withstanding standoff voltages between components on the semiconductor device of 500 volts or more.

Also, one or more embodiments provide a semiconductor device comprising a silicon substrate comprising sidewalls that are encapsulated with one or more materials having high field strength, wherein encapsulation of the sidewalls with the one or more materials enables the silicon device to withstand breakdown voltages between components on the semiconductor device of at least 500 volts.

Also, according to one or more embodiments, a method for fabricating a semiconductor device is provided, comprising depositing, within a silicon substrate of a wafer on which semiconductor devices are formed, vertical layers of one or more materials having a high field strength at boundaries of the semiconductor devices; and separating the semiconductor devices to yield singulated semiconductor devices having sidewalls that are encapsulated by the one or more materials, wherein encapsulation sidewalls by the one or more materials enables the singulated semiconductor devices to withstanding standoff voltages between components on the singulated semiconductor devices of 500 volts or more.

DETAILED DESCRIPTION

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Figure 1:
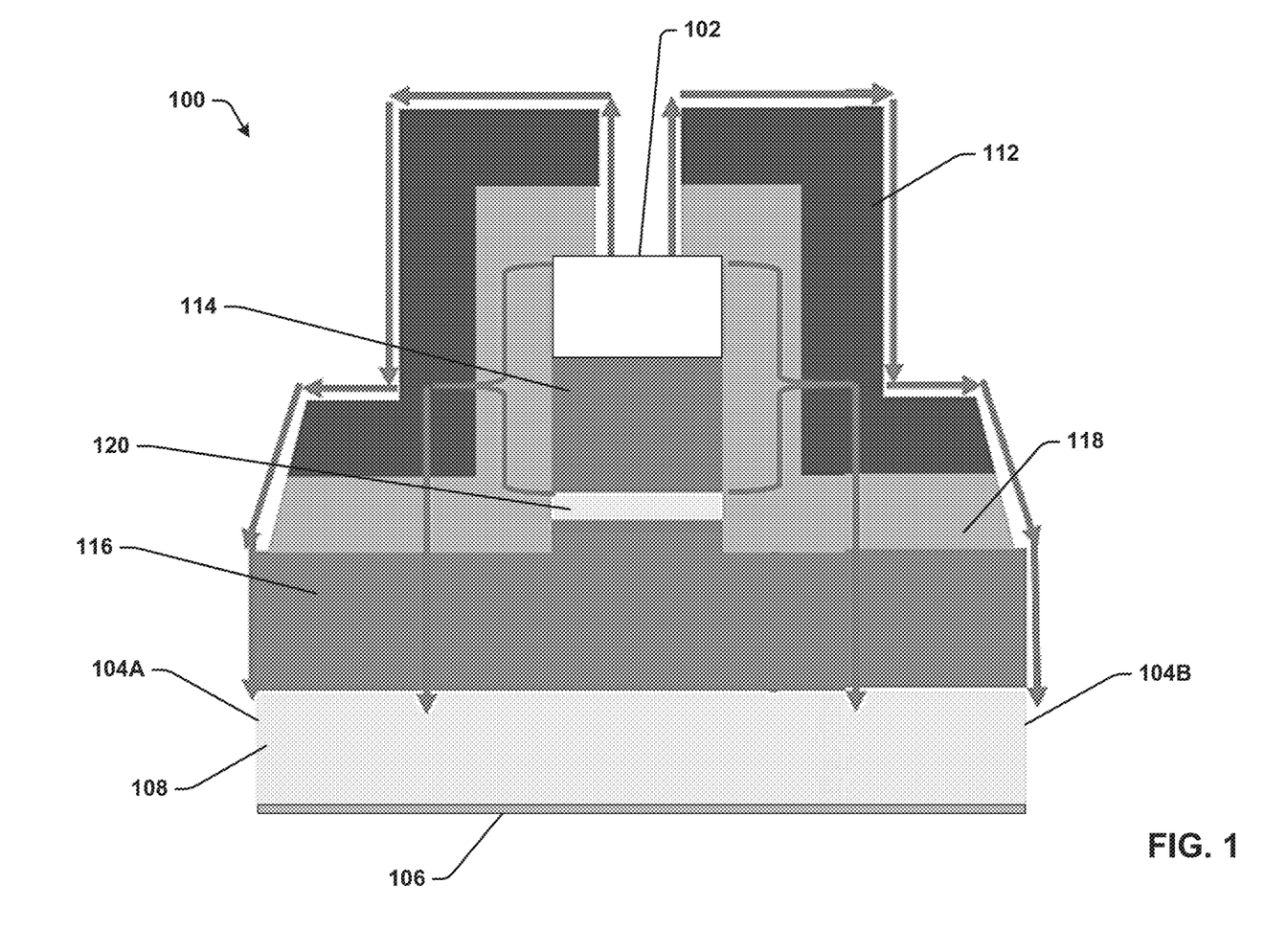
FIG. 1 is a cross-sectional view of an example semiconductor device illustrating possible electric field flux/paths for arcing/discharge.

FIG. 1 is a cross-sectional view of an example semiconductor device 100 illustrating possible electric field paths for arcing or discharge that contributes to low breakdown voltage. Although the semiconductor device 100 is depicted as a multi-kilovolt capacitor in FIG. 1, it is to be appreciated that the encapsulation approaches described herein are applicable to substantially any type of passive or active semiconductor device, including but not limited to diodes, transistors (e.g., bipolar junction transistors, field-effect transistors, heterojunction bipolar transistors, insulated gate bipolar transistors, etc.), thyristors, resistors inductors, filters, or other such devices. In this example, semiconductor device 100 comprises a layer of silicon substrate 108 that serves as the bottom terminal of a device, on which is formed a layer of backside metalization 106. One or more dielectric layers 116 (e.g., silicon dioxide, silicon nitride, etc.) are deposited on the top surface of the silicon substrate 108. Layers of low temperature oxide 120 and doped polysilicon 114 are deposited over the dielectric layer(s) 116. A top metal layer 102 serving as the top device terminal is formed on the doped polysilicon 114. A silicon nitride layer 118 and a benzocyclobutene (BCB) layer 112 are deposited around the top metal layer 102. As noted above, this design and type of semiconductor device is only intended to be exemplary, and the encapsulation techniques described herein are not to be construed as being limited to the particular semiconductor device design or type illustrated in FIG. 1. For example, while silicon nitride and BCB are examples of insulators, or high field strength materials, other inorganic insulators or high field strength polymers can be employed.

The electric field strength of the dielectric materials used to provide electrical isolation in many semiconductor devices, as well as the electrical path length between opposing terminals of those devices, limits the ability of these devices to withstand high standoff voltage bias. For example, the sidewalls 104 of the die, which are exposed by the process of separating the die from its wafer (e.g., via sawing, laser cutting, deep reactive ion etching (DRIE), or scribing) are typically highly conductive and thus yield a potential breakdown path represented by the arrows in FIG. 1 (although a die with a square or rectangular footprint will have four sidewalls 104, only two opposing sidewalls 104A and 104B are visible in the cross-sectional view of FIG. 1). The length of this electrical path can limit the ability of the semiconductor device 100 to withstand high standoff voltages since the electric field is not confined to materials having high dielectric constant and high field strength, particularly if extremely low field strength (approximately 3 volts/micrometer) air gaps or breaks are present in the electrical path between the terminals.

These limitations are difficult to overcome when the bias potential that is applied across the terminals of the device 100 exceed a few hundred volts, preventing the device from achieving higher breakdown voltages. The ability of a semiconductor device to support higher breakdown voltages can be critical in device applications that require bias voltages in the kilovolt or multi-kilovolt range. Although ceramic materials with high dielectric constants can be used for devices in applications requiring bias voltages in the range of kilovolts, the use of ceramic materials limits the applicability to passive device structures only.

To address these and other issues, one or more embodiments described herein provide a semiconductor device architecture in which the sidewalls of the silicon substrate are passivated by encapsulating the sidewalls 104 in dielectric materials having high electric field strength. Encapsulating all the sidewalls 104 using high field strength dielectric materials eliminates electrical paths in air or vacuum and confines the electric fields in these high field strength materials, increasing the breakdown voltage relative to unencapsulated devices and allowing the device to withstand greater standoff voltages. In some cases, encapsulating the sidewalls 104 in this manner can allow the device to withstand voltages of 3000V or greater.

Substantially any dielectric material, or combination of dielectric materials, having high field strength can be used to encapsulate the sidewalls 104 in a manner that achieves higher breakdown voltage for the device. FIGS. 2a-5b illustrate four example approaches for achieving this sidewall encapsulation for an example semiconductor device. However, other materials and designs for achieving this sidewall encapsulation are also within the scope of one or more embodiments of this disclosure.

Figure 2A:
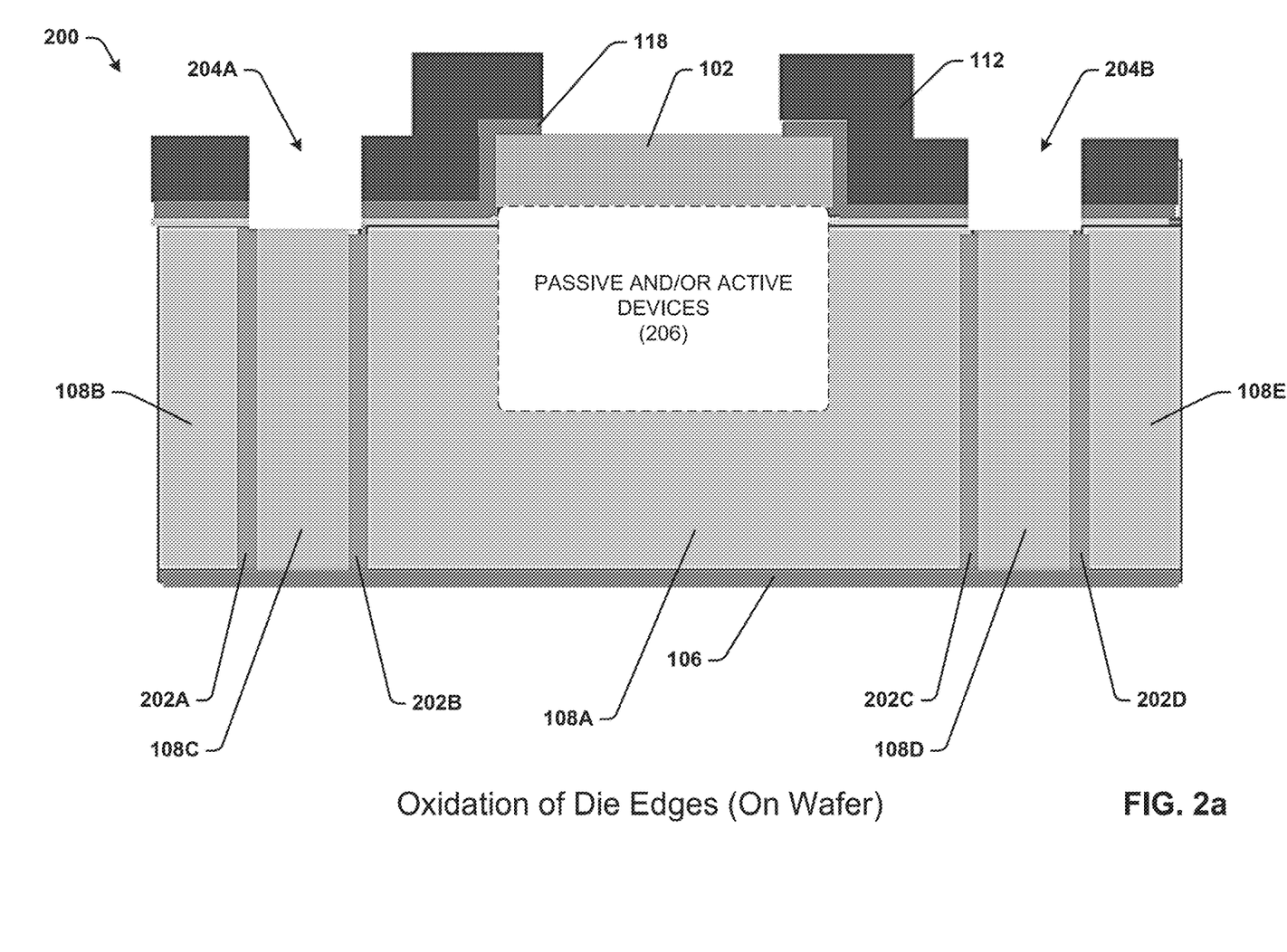
FIG. 2a is a cross-sectional view of a wafer illustrating encapsulation by oxidation of die edges.

FIG. 2a is a cross-sectional view of a wafer 200 on which multiple semiconductor devices are formed, illustrating encapsulation by oxidation of die edges. FIG. 2a depicts the wafer 200 prior to being diced into separate dies. Each device on the wafer 200 comprises a top metal layer 102 which serves as a top terminal for one or more passive or active devices 206 formed in the die, and a silicon nitride layer 118 and a BCB layer 112 that are deposited around the top metal layer 102. A silicon substrate 108A serves as the bottom terminal of the one or more passive or active devices 206 and is formed a layer of backside metalization 106.

Saw or dicing streets 204 are formed as gaps between the silicon nitride layers 118 and BCB layers 112 of adjacent devices on the wafer 200 (only two streets 204A and 204B are depicted in the cross-section of FIG. 2a). During the dicing step, the sections of silicon substrate 108C and 108D below these streets 204A and 204B (as well as sections of the bottom metalization 106 formed on these sections) will be removed via sawing, laser cutting, breaking, or other such dicing means, dividing the wafer 200 into final singulated dies.

Figure 2B:
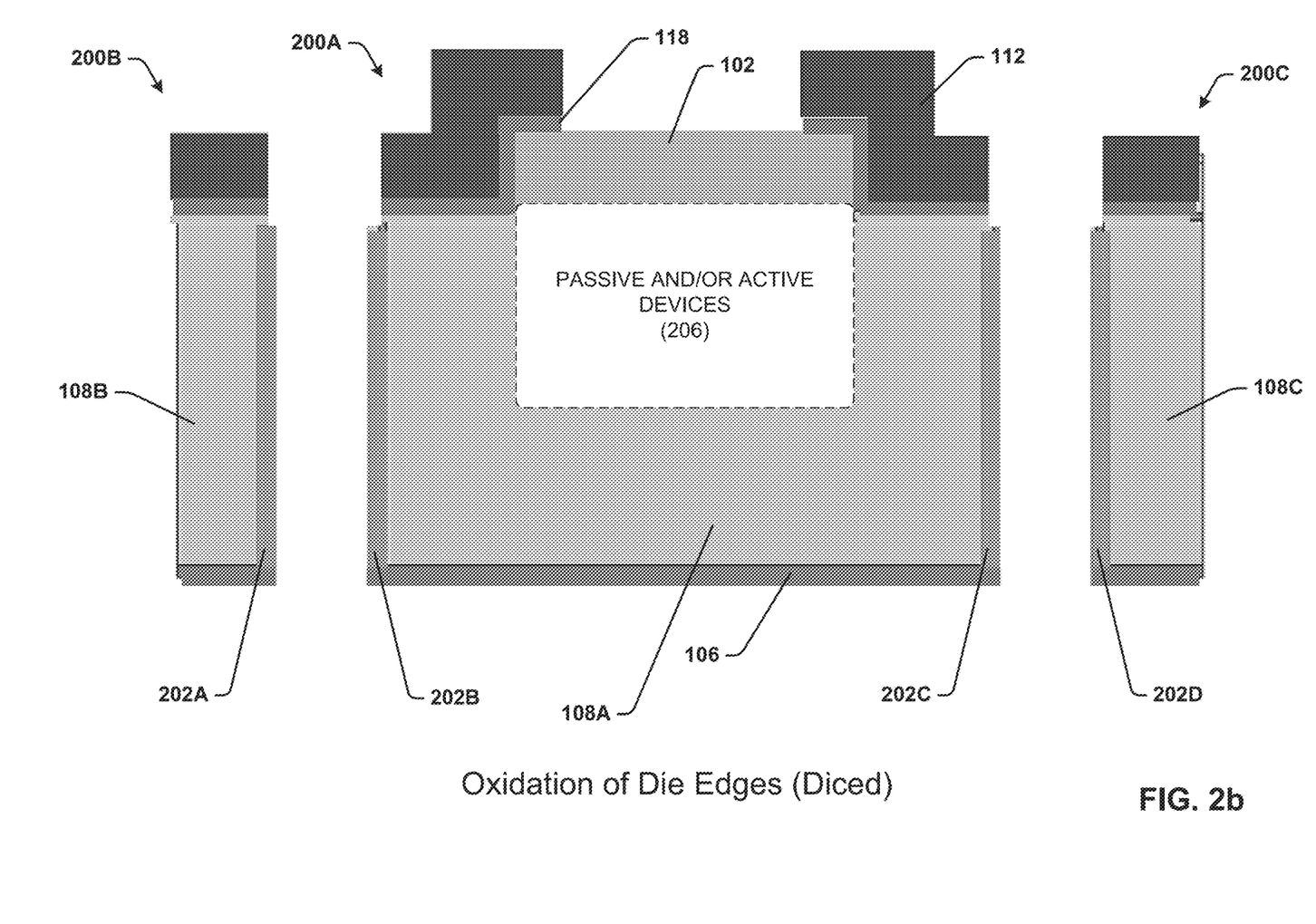
FIG. 2b is a cross-sectional view of singulated dies having sidewalls that are encapsulated by oxidation of die edges.

In this example, vertical layers of thick thermal oxide 202 are formed within the layer of silicon substrate 108 adjacent to the edges of the cutting paths. When the wafer 200 is diced to separate the dies—that is, when the intermediate sections of silicon substrate 108C and 108D below the dicing streets 204 are removed—each layer of thermal oxide 202 remains with its corresponding singulated die. FIG. 2b is a cross-sectional view of the resulting singulated dies 200A-200C after the wafer 200 is diced (only singulated die 200A is shown in full cross-section in FIG. 2b, with only portions of adjacent dies 200B and 200C visible for clarity). Rather than exposing the sidewalls of the portion of silicon substrate 108A that remains as part of the die 200A, dicing the wafer 200 exposes the layers of thermal oxide 202B and 202C (as well as the layers of thermal oxide formed on the other two walls of the die 200A not visible in FIG. 2a or 2b). These layers of thermal oxide 202B and 202C are formed on the surfaces of the sidewalls and thus encapsulate all sidewalls of the die 200A after dicing. The sidewalls of the silicon substrates 108B and 108C of dies 200B and 200C are similarly encapsulated (see, e.g., the layers of thermal oxide 202A and 202D).

With the sidewalls of the die 200A encapsulated with thermal oxide 202—a material having a high field strength—electrical paths through air or vacuum are eliminated and, when a voltage is applied to the terminals of the device, the electric fields are confined to materials having a high field strength, increasing the breakdown voltage of the device relative to dies having unencapsulated sidewalls.

Figure 3A:
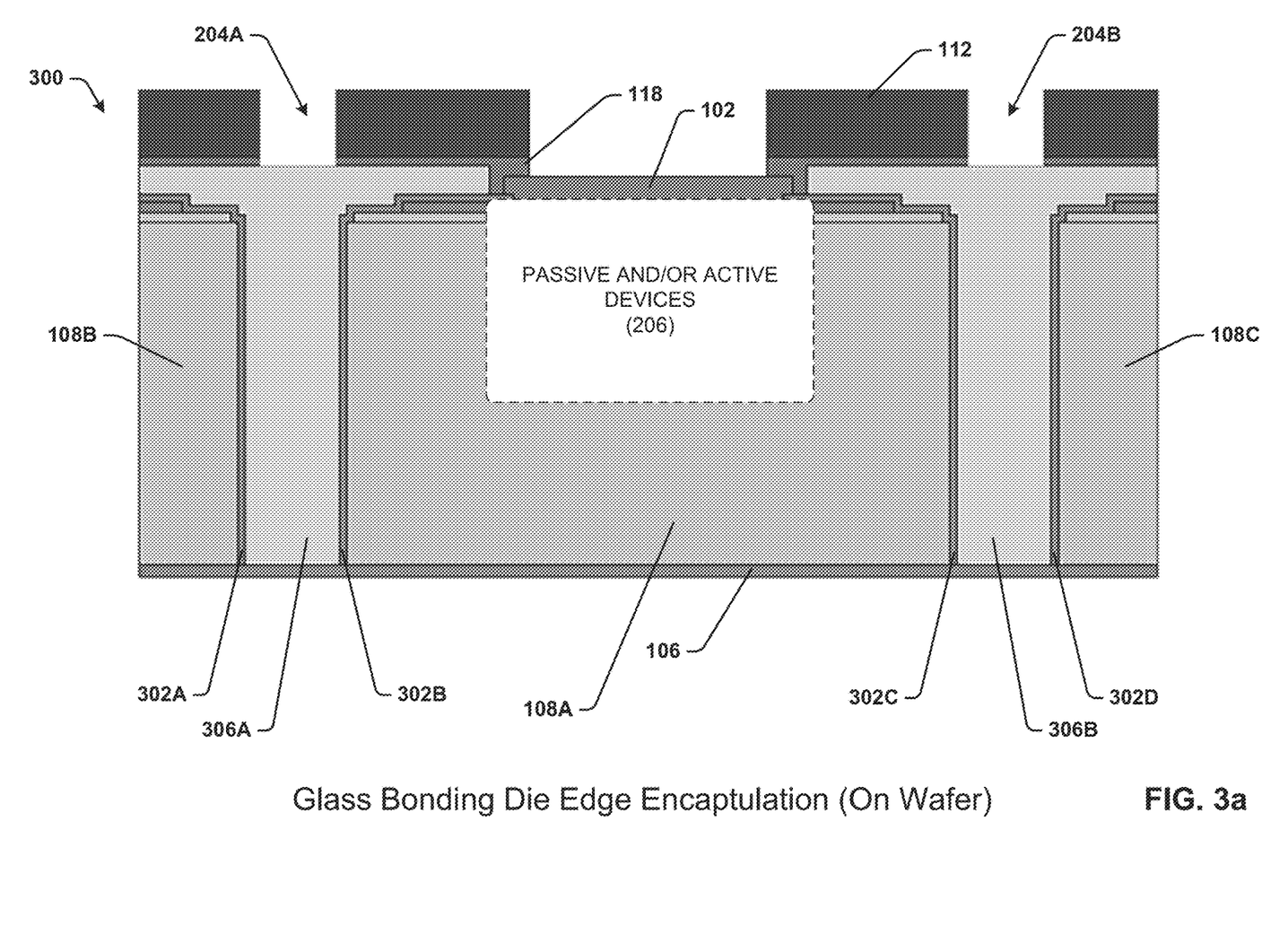
FIG. 3a is a cross-sectional view of a wafer illustrating encapsulation of sidewalls by glass bonding.
Figure 3B:
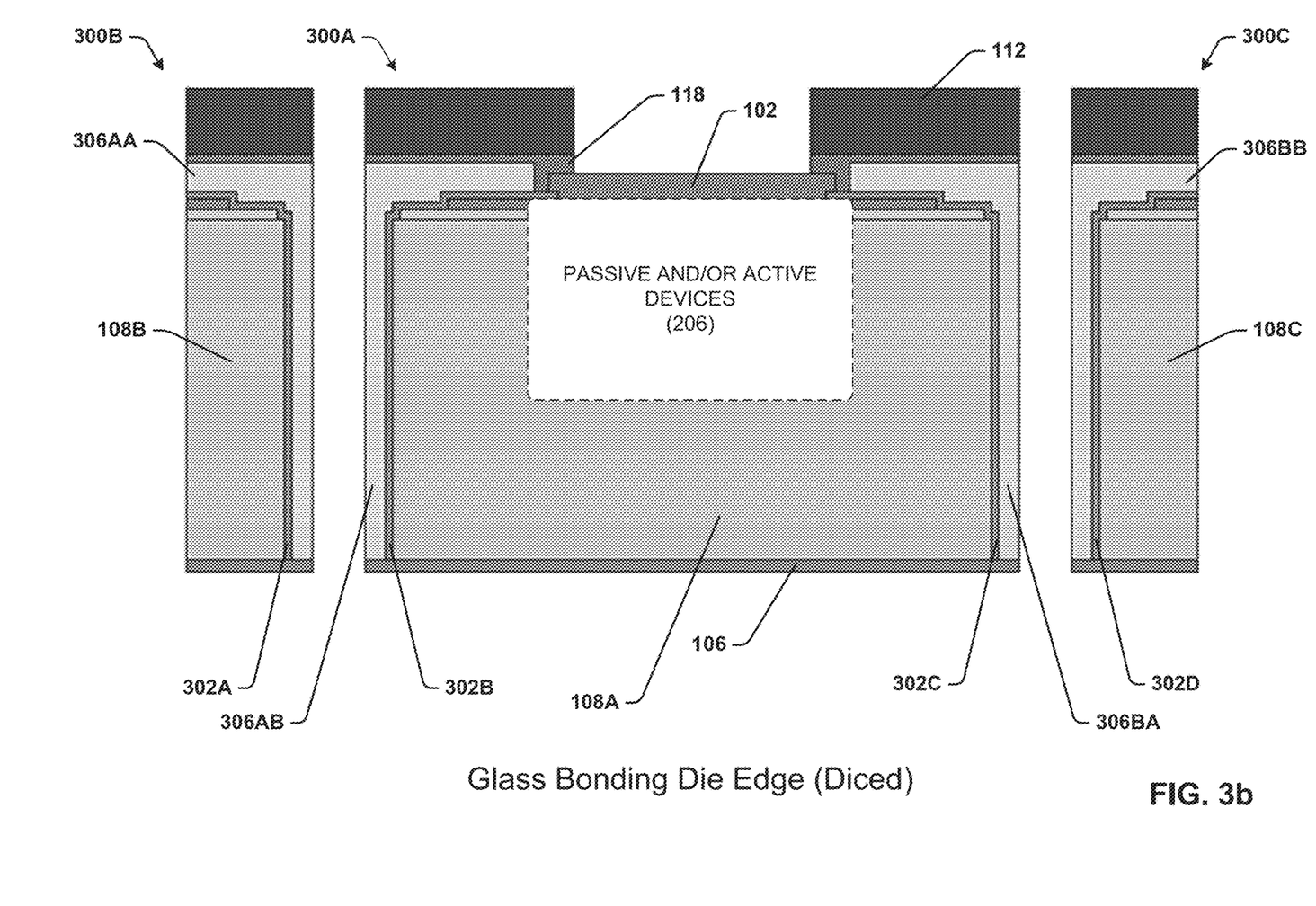
FIG. 3b is a cross-sectional view of singulated dies having sidewalls that are encapsulated by glass bonding.

FIG. 3a is a cross-sectional view of another wafer 300 illustrating encapsulation of sidewalls by glass bonding. FIG. 3b is a cross-sectional view of the singulated dies 300A-300C that are produced by dicing the wafer 300. In this example, rather than encapsulating the sidewalls using layers of thermal oxide 202 as depicted in FIGS. 2a and 2b, each sidewall is encapsulated using a layer of silicon nitride 302 and a layer of borosilicate glass 306. According to an example approach for achieving this encapsulation on die 300A, a layer of silicon nitride 302 can be deposited on the sidewalls of the die's silicon substrate 108A (see the layers of silicon nitride 302B and 302C, which represent the cross-section of the silicon nitride layer for die 300A). The spaces between adjacent dies, including the areas below the dicing streets 204, are filled with borosilicate glass 306 as shown in FIG. 3a. In the illustrated example, layer 306A fills the space between substrates 108B and 108A, and layer 306B fills the space between substrates 108A and 108C. When the wafer 300 is diced as shown in FIG. 3b, middle sections of the borosilicate glass 306 are removed to separate the dies 300A-300C, leaving the sidewalls of the silicon substrate 108A of each die encapsulated with layers of silicon nitride 302 and borosilicate glass 306 (e.g., glass layer 306A is divided into layers 306AA and 306AB, and glass layer 306B is divided into layers 306BA and 306BB). In this approach, the silicon substrates 108A-108C of the respective dies 300A-300C can be separated by distances that permit the widths of the borosilicate glass 306 between the dies 300A-300C to be greater than the width of the cutting mechanism used to separate the dies, so that a portion of the borosilicate glass 306 remains on each die after dicing.

Figure 4A:
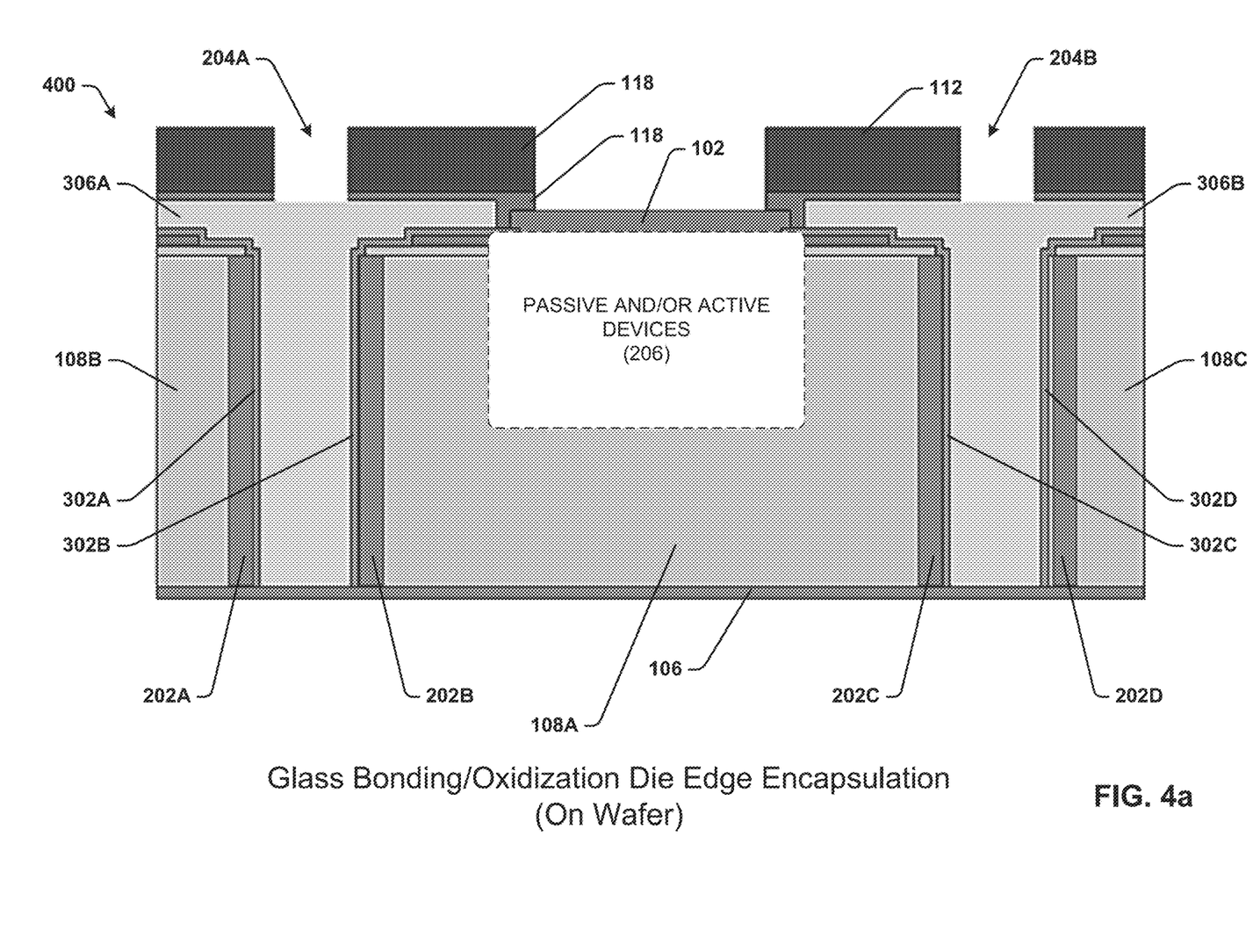
FIG. 4a is a cross-sectional view of a wafer illustrating encapsulation of sidewalls by a combination of glass bonding and oxidation.
Figure 4B:
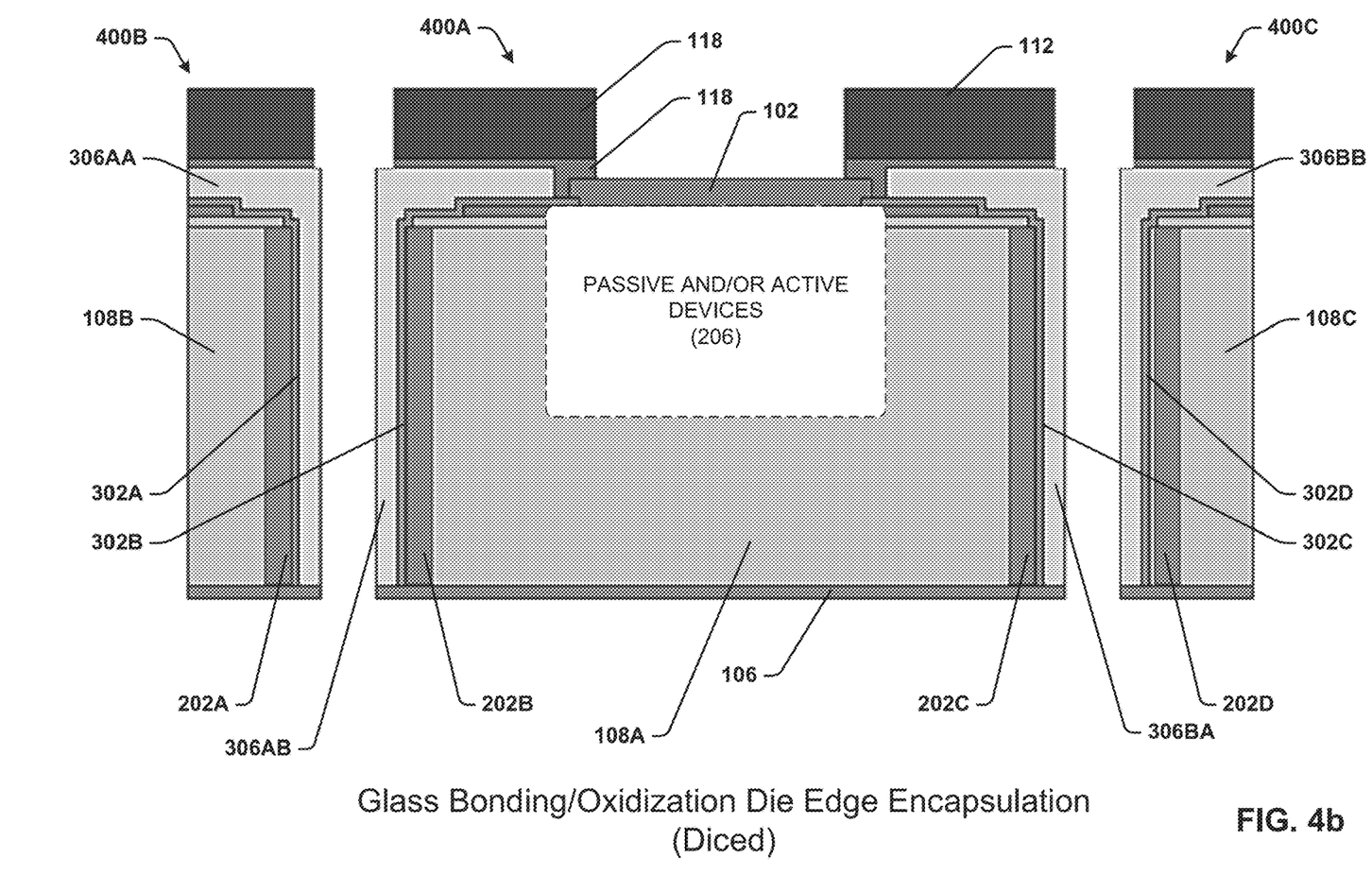
FIG. 4b is a cross-sectional view of singulated dies having sidewalls that are encapsulated by glass bonding and oxidation.

FIG. 4a is a cross-sectional view of another wafer 400 illustrating encapsulation of sidewalls by a combination of glass bonding (see FIGS. 3a and 3b) and oxidation (see FIGS. 2a and 2b). FIG. 4b is a cross-sectional view of the of the singulated dies 400A-400C that are produced by dicing the wafer 400. According to this approach, the sidewalls of the silicon substrate 108A for each die are encapsulated using layers of thermal oxide 202, as described above in connection with FIGS. 2a and 2b. In addition, the sidewalls are further encapsulated with a layer of silicon nitride 302 and a layer of borosilicate glass 306 using techniques described above in connection with FIGS. 3a and 3b.

Figure 5A:
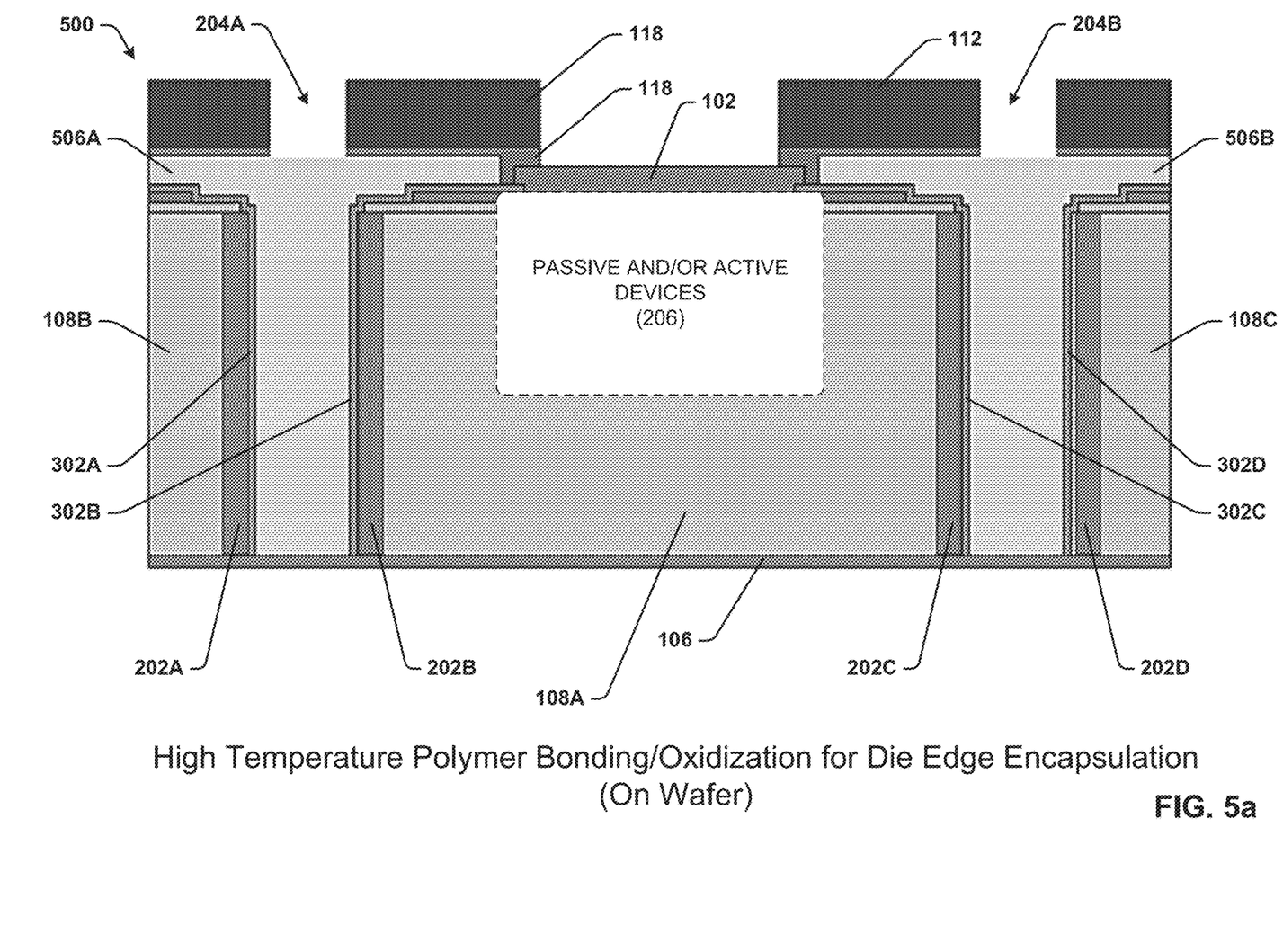
FIG. 5a is a cross-sectional view of a wafer illustrating encapsulation of sidewalls by a combination of high temperature polymer bonding and oxidation.
Figure 5B:
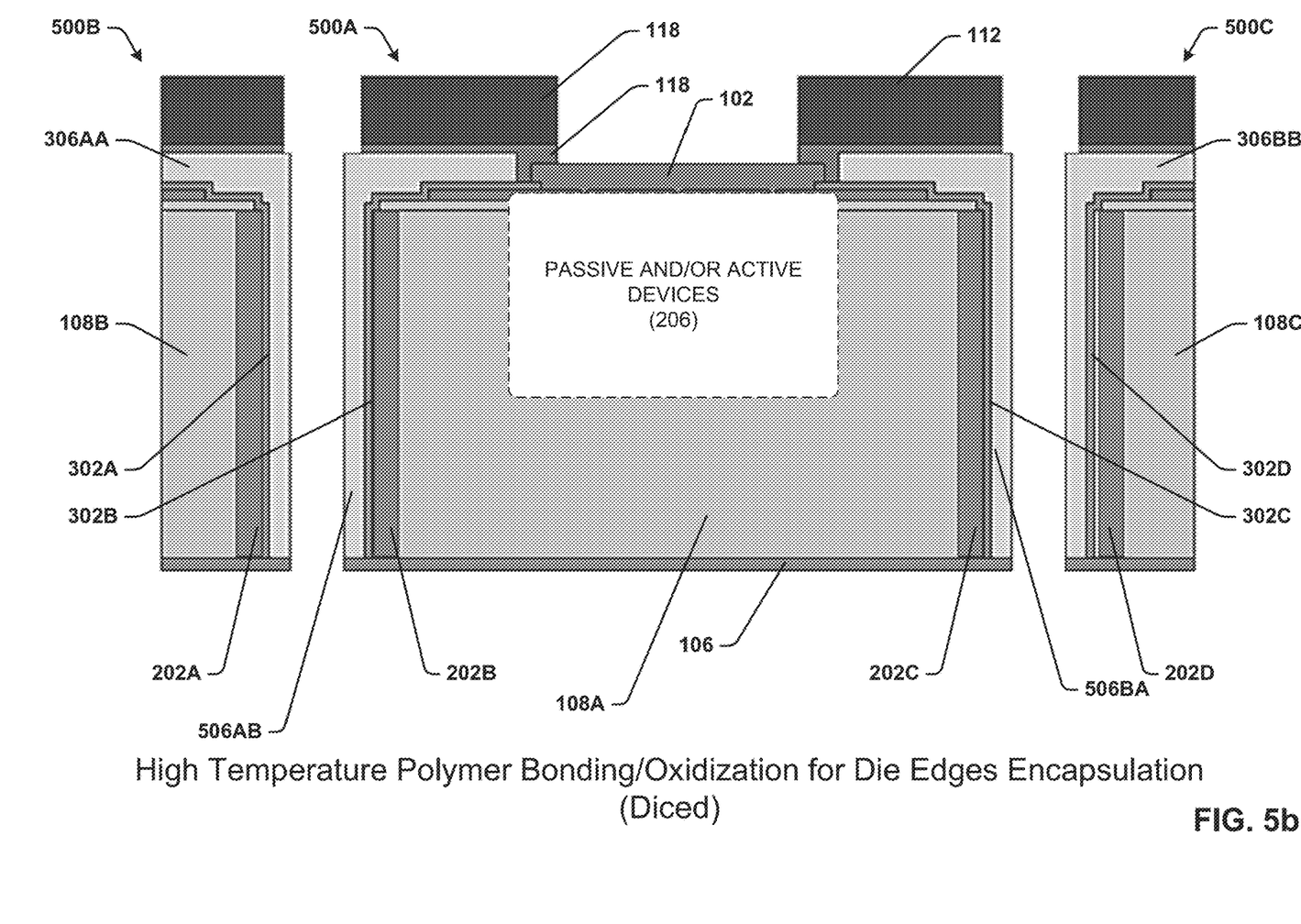
FIG. 5b is a cross-sectional view of singulated dies having sidewalls that are encapsulated by high temperature polymer bonding and oxidation.

FIG. 5a is a cross-sectional view of another wafer 500 illustrating encapsulation of sidewalls by a combination of high temperature polymer bonding and oxidation. FIG. 5b is a cross-sectional view of the of the singulated dies 500A-500C that are produced by dicing the wafer 500. This example design is similar to that depicted in FIGS. 4a and 4b, but replaces the layers of borosilicate glass 306 with layers of high temperature polymer 506, yielding dies 500A-500C whose substrate sidewalls are encapsulated with thick thermal oxide 202, silicon nitride 302, and high temperature polymer 506.

Figure 6:
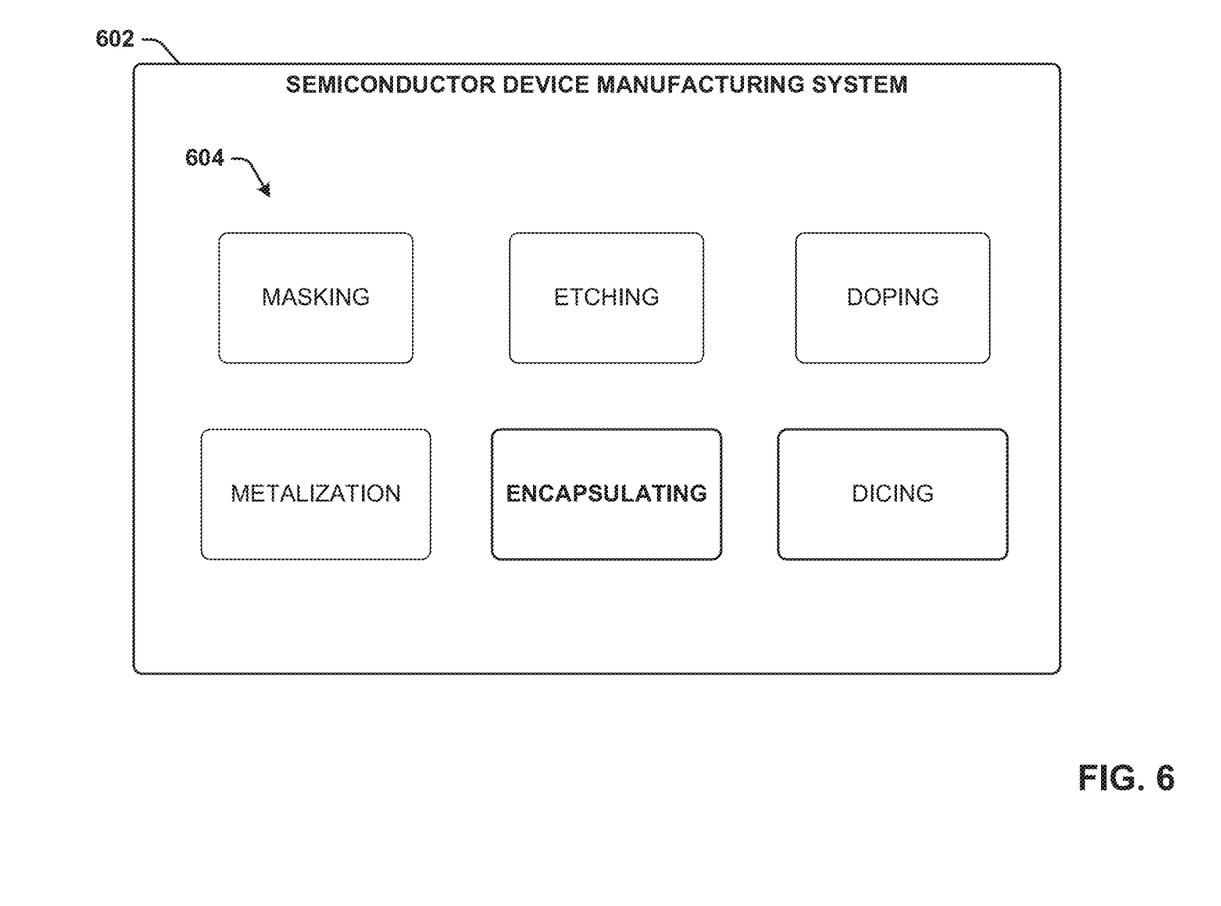
FIG. 6 is a generalized diagram of an example semiconductor device manufacturing system that implements various processes for fabricating semiconductor devices, including masking, etching, doping, metalization, and dicing processes.

FIG. 6 is a generalized diagram of an example semiconductor device manufacturing system 602 that implements various processes 604 for fabricating semiconductor devices, including masking, etching, doping, metalization, and dicing processes. The processes also include encapsulation of the sidewalls of each singulated die with one or more dielectric materials having high field strength, which can allow the resulting semiconductor devices to withstand standoff voltages between components of the semiconductor devices of 500 volts or more. The encapsulation process can comprise any of the example encapsulation processes described above in connection with FIGS. 2a-5b, or another suitable process that yields semiconductor devices having sidewalls encapsulated with one or more high field strength materials.

The sidewall encapsulation techniques described herein can be realized using standard silicon semiconductor batch fabrication processes and materials, including but not limited to glass, low pressure chemical vapor deposition (LPCVD) conformal silicon nitride, silicon diode depositions, and various atomic layer deposition (ALD) oxides and nitrides. Dielectric films that can be used include, but are not limited to, various oxides and nitrides such as aluminum oxide ($Al_2O_3$), aluminum nitride (AlN), hafnium oxide ($HfO_2$), hafnium nitrude (HfN), lanthanum oxide ($La_2O_3$), silicon dioxide ($SiO_2$), titanium dioxide ($TiO_2$), zinc oxide (ZnO), zirconium oxide ($ZrO_2$), scandium oxide ($Sc_2O_3$), and gallium trioxide ($Ga_2O_3$). Such dielectric films can reduce the cost and size of the final semiconductor devices relative to high dielectric constant ceramic structures.

Also, the use of silicon as the basis of the encapsulating materials enables active devices (e.g., diodes, transistors, thyristors, etc.), passive devices (e.g., capacitors, resistors, inductors, filters, etc.), and heterogeneous II-V materials (e.g., GaN-on-Si; GaAs-on-Si; InP-on-Si) and high-electron-mobility transistor (HEMT) devices to be realized in a monolithic kilovolt integrated circuit whose breakdown voltages are increased via sidewall encapsulation. Since this sidewall encapsulation technique is a silicon-based technology, some electrical characteristics can be improved relative to ceramic-based solutions (e.g., capacitance variation versus temperature, low parasitic loss, small footprint and low profile, low equivalent series resistance (ESR), low equivalent series inductance (ESL), high volume efficiency, temperature and volume linearity, low terminal electrical leakage, etc.).

Figure 7:
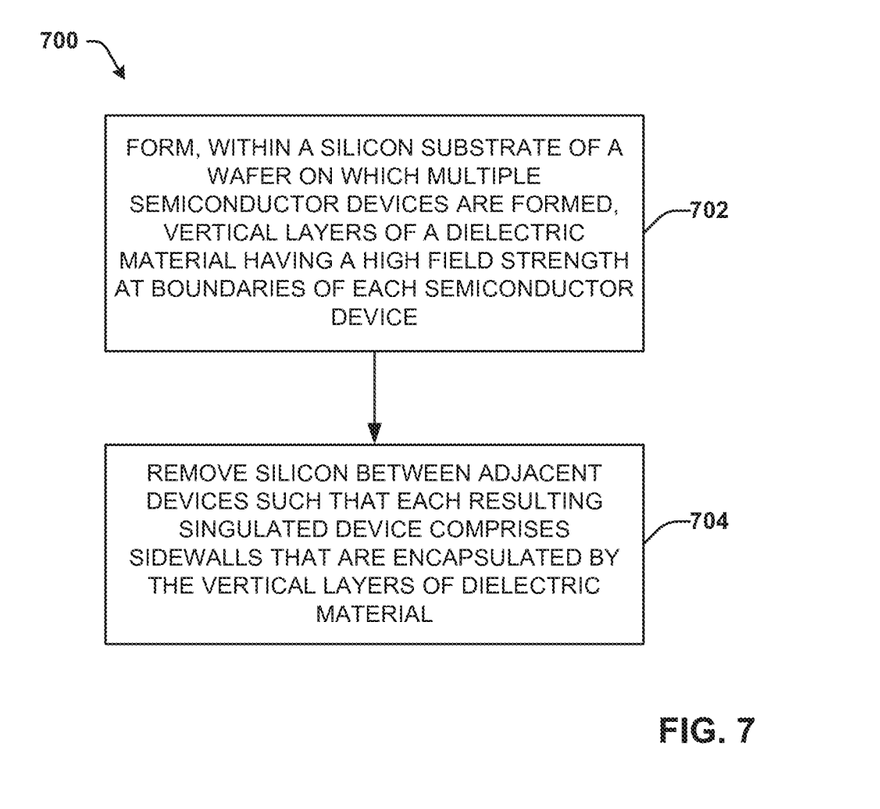
FIG. 7 is a flow diagram of an example, non-limiting methodology for fabricating active or passive semiconductor devices such that the sidewalls of the silicon substrate are encapsulated in dielectric materials having high electric field strength, yielding devices that support high breakdown voltages.

FIG. 7 illustrates a methodology in accordance with one or more embodiments of the subject application. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 7 is a flow diagram of an example, non-limiting methodology 600 for fabricating active or passive semiconductor devices such that the sidewalls of the silicon substrate are encapsulated in dielectric materials having high electric field strength, yielding devices that support high breakdown voltages. Initially, at 702, vertical layers of a dielectric material having high electric field strength are formed within a silicon substrate of a wafer on which multiple active or passive semiconductor devices are formed. The vertical layers of dielectric material are formed at the boundaries of each semiconductor device on the wafer. Materials that can be used for the vertical layers can include, but are not limited to, thermal oxide, silicon nitride, borosilicate glass, aluminum oxide ($Al_2O_3$), aluminum nitride (AlN), hafnium oxide ($HfO_2$), hafnium nitrude (HfN), lanthanum oxide ($La_2O_3$), silicon dioxide ($SiO_2$), titanium dioxide ($TiO_2$), zinc oxide (ZnO), zirconium oxide ($ZrO_2$), scandium oxide ($Sc_2O_3$), gallium trioxide ($Ga_2O_3$), or high temperature polymer. The vertical layers can also comprise combinations of any two or more of these materials.

At 704, sections of the silicon substrate between adjacent devices on the wafer are removed—e.g., by sawing, laser cutting, deep reactive ion etching (DRIE) or scribing—to singulate the devices, such that each resulting singulated device comprises sidewalls that are encapsulated by the vertical layers of dielectric material formed at the boundaries of the device. Encapsulating all the sidewalls using high field strength dielectric materials in this manner can eliminate electrical paths in air or vacuum and confine the electric fields in the high field strength encapsulating materials, allowing the device to withstand greater standoff voltages relative to unencapsulated devices.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Unless otherwise indicated in the examples and elsewhere in the specification and claims, all parts and percentages are by weight, all temperatures are in degrees Centigrade, and pressure is at or near atmospheric pressure.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for fabricating a semiconductor device, comprising:
    depositing, within a silicon substrate of a wafer on which semiconductor devices are formed, vertical layers of one or more materials having a high field strength at boundaries of the semiconductor devices; and
    separating the semiconductor devices to yield singulated semiconductor devices having sidewalls that are encapsulated by the one or more materials, wherein encapsulation sidewalls by the one or more materials enables the singulated semiconductor devices to withstanding standoff voltages between components on the singulated semiconductor devices of 500 volts or more.

2. The method of claim 1, wherein the depositing comprises depositing vertical layers of at least one of thermal oxide, silicon nitride, borosilicate glass, aluminum oxide (Al2O3), aluminum nitride (AlN), hafnium oxide (HfO2), hafnium nitride (HfN), lanthanum oxide (La2O3), silicon dioxide (SiO2), titanium dioxide (TiO2), zinc oxide (ZnO), zirconium oxide (ZrO2), scandium oxide (Sc2O3), gallium trioxide (Ga2O3), or high temperature polymer.

3. The method of claim 1, wherein the singulated semiconductor devices are capable of withstanding standoff voltages between components on the singulated semiconductor devices of 1,000 volts or more.

4. The method of claim 1, wherein the depositing comprises:
    depositing a layer of silicon nitride on the sidewalls; and
    depositing a layer of borosilicate glass on the layer of silicon nitride.

5. The method of claim 1, wherein the depositing comprises:
    depositing a layer of thermal oxide on the sidewalls;
    depositing a layer of silicon nitride on the layer of thermal oxide; and
    depositing a layer of borosilicate glass on the layer of silicon nitride.

6. The method of claim 1, wherein the depositing comprises:
    depositing a layer of thermal oxide on the sidewalls;
    depositing a layer of silicon nitride on the layer of thermal oxide; and
    depositing a layer of high temperature polymer on the layer of silicon nitride.

7. The method of claim 1, wherein the semiconductor device is at least one of a diode, a transistor, a thyristor, a capacitor, a resistor, an inductor, a filter, or a high-electron-mobility transistor (HEMT) device.

8. The method of claim 1, wherein the depositing comprises:
    depositing a layer of silicon nitride on the sidewalls.

9. The method of claim 1, wherein the depositing comprises:
    depositing a layer of thermal oxide on the sidewalls.

10. The method of claim 1, wherein the separating comprises:
    sawing the semiconductor devices to yield the singulated semiconductor devices.

11. The method of claim 1, wherein the separating comprises:
    laser cutting the semiconductor devices to yield the singulated semiconductor devices.

12. The method of claim 1, wherein the separating comprises:
    etching the semiconductor devices to yield the singulated semiconductor devices.

13. The method of claim 1, wherein the separating comprises:
    scribing the semiconductor devices to yield the singulated semiconductor devices.

14. The method of claim 1, wherein the one or more materials comprise a dielectric material.

15. The method of claim 1, wherein the semiconductor devices comprise active semiconductor devices.

16. The method of claim 1, wherein the semiconductor devices comprise passive semiconductor devices.

17. The method of claim 1, wherein all sidewalls of each singulated semiconductor device are encapsulated by the one or more materials.

18. The method of claim 1, wherein the one or more materials comprise an inorganic insulator.

19. The method of claim 1, wherein the one or more materials comprise a high field strength polymer.

20. The method of claim 1, wherein the singulated semiconductor devices are capable of withstanding standoff voltages between components on the singulated semiconductor devices of 3,000 volts or more.

* * * * *